(12) United States Patent
Wright et al.

(10) Patent No.: US 10,008,617 B2
(45) Date of Patent: Jun. 26, 2018

(54) CO-EXTRUDED MULTI-LAYER POLYESTER FILMS HAVING HYDROLYTIC STABILITY AND IMPROVED DELAMINATION RESISTANCE

(71) Applicant: DUPONT TEIJIN FIMS U.S. LIMITED PARTNERSHIP, Chester, VA (US)

(72) Inventors: Tina Wright, County Durham (GB); Rachel Little, Glasgow (GB); William James Brennan, Middlesbrough (GB); Erik Jevon Nelson, Chester, VA (US); Mark Russell Hodgson, Teeside (GB); Nori Mandokoro, Midlothian, VA (US)

(73) Assignee: DuPont Teijin Films U.S. Limited Partnership, Chester, VA (US)

( * ) Notice: Subject to any disclaimer, the term of this patent is extended or adjusted under 35 U.S.C. 154(b) by 0 days. days.

(21) Appl. No.: 15/024,962

(22) PCT Filed: Sep. 23, 2014

(86) PCT No.: PCT/GB2014/052890
§ 371 (c)(1),
(2) Date: Mar. 25, 2016

(87) PCT Pub. No.: WO2015/049487
PCT Pub. Date: Apr. 9, 2015

(65) Prior Publication Data
US 2016/0233349 A1   Aug. 11, 2016

(30) Foreign Application Priority Data

Oct. 3, 2013   (GB) .................................. 1317551.8

(51) Int. Cl.
*B32B 27/08*   (2006.01)
*B32B 27/18*   (2006.01)
(Continued)

(52) U.S. Cl.
CPC .... *H01L 31/02168* (2013.01); *B29C 47/0004* (2013.01); *B29C 47/0021* (2013.01);
(Continued)

(58) Field of Classification Search
None
See application file for complete search history.

(56) References Cited

U.S. PATENT DOCUMENTS 3,244,708 A   4/1966   Duennenberger
3,372,143 A   3/1968   Terada
(Continued)

FOREIGN PATENT DOCUMENTS

CA   2514589   8/2004
CN   101412591   4/2009
(Continued)

OTHER PUBLICATIONS

Cardura E10P Product Bulletin, 4 pgs., 2006.
(Continued)

*Primary Examiner* — Vivian Chen
(74) *Attorney, Agent, or Firm* — RatnerPrestia

(57) ABSTRACT

A co-extruded multi-layer biaxially oriented polyester film comprising a primary polyester layer and a dissimilar secondary polyester layer adjacent to the primary polyester layer, wherein the primary polyester layer and the secondary polyester layer each comprise a glycidyl ester of a branched monocarboxylic acid, wherein the monocarboxylic acid has from 5 to 50 carbon atoms, and wherein said glycidyl ester is in the form of its reaction product with at least some of the end groups of the polyester; and use thereof as a component of a photovoltaic cell.

40 Claims, 1 Drawing Sheet

(51) Int. Cl.

| | | |
|---|---|---|
| *B32B 27/20* | (2006.01) | |
| *B32B 27/36* | (2006.01) | |
| *B32B 37/15* | (2006.01) | |
| *B29C 47/04* | (2006.01) | |
| *B29C 47/06* | (2006.01) | |
| *H01L 31/049* | (2014.01) | |
| *C08L 67/02* | (2006.01) | |
| *C08K 3/013* | (2018.01) | |
| *C08K 3/32* | (2006.01) | |
| *C08K 3/34* | (2006.01) | |
| *C08K 3/36* | (2006.01) | |
| *C08K 5/101* | (2006.01) | |
| *C08K 5/1515* | (2006.01) | |
| *H01L 31/0216* | (2014.01) | |
| *B29C 47/02* | (2006.01) | |
| *B32B 37/14* | (2006.01) | |
| *B32B 43/00* | (2006.01) | |
| *B29C 47/00* | (2006.01) | |
| *C08K 3/30* | (2006.01) | |
| *C08K 3/22* | (2006.01) | |
| *C08K 5/00* | (2006.01) | |
| *B29K 67/00* | (2006.01) | |
| *B29L 31/34* | (2006.01) | |

(52) U.S. Cl.
CPC ...... *B29C 47/0026* (2013.01); *B29C 47/0057* (2013.01); *B29C 47/025* (2013.01); *B29C 47/065* (2013.01); *B32B 27/08* (2013.01); *B32B 27/20* (2013.01); *B32B 27/36* (2013.01); *B32B 37/14* (2013.01); *B32B 43/006* (2013.01); *B29C 47/00* (2013.01); *B29C 47/04* (2013.01); *B29C 47/06* (2013.01); *B29K 2067/00* (2013.01); *B29K 2067/003* (2013.01); *B29L 2031/34* (2013.01); *B32B 27/18* (2013.01); *B32B 37/15* (2013.01); *B32B 37/153* (2013.01); *B32B 2250/02* (2013.01); *B32B 2250/244* (2013.01); *B32B 2264/102* (2013.01); *B32B 2264/104* (2013.01); *B32B 2307/41* (2013.01); *B32B 2307/412* (2013.01); *B32B 2307/414* (2013.01); *B32B 2307/518* (2013.01); *B32B 2307/71* (2013.01); *B32B 2307/712* (2013.01); *B32B 2307/714* (2013.01); *B32B 2307/748* (2013.01); *B32B 2367/00* (2013.01); *B32B 2457/12* (2013.01); *C08K 3/013* (2018.01); *C08K 3/22* (2013.01); *C08K 3/34* (2013.01); *C08K 3/346* (2013.01); *C08K 3/36* (2013.01); *C08K 5/00* (2013.01); *C08K 5/005* (2013.01); *C08K 5/101* (2013.01); *C08K 5/1515* (2013.01); *C08K 2003/2206* (2013.01); *C08K 2003/2227* (2013.01); *C08K 2003/2241* (2013.01); *C08K 2003/3045* (2013.01); *C08L 67/02* (2013.01); *H01L 31/049* (2014.12); *Y10T 428/31786* (2015.04)

(56) References Cited

U.S. PATENT DOCUMENTS

| | | |
|---|---|---|
| 3,657,191 A | 4/1972 | Tizmann |
| 3,843,371 A | 10/1974 | Piller |
| 3,869,427 A | 3/1975 | Meschke |
| 4,115,350 A | 9/1978 | Lazarus |
| 4,130,541 A | 12/1978 | Lazarus |
| 4,152,318 A | 5/1979 | Lazarus |
| 4,446,262 A | 5/1984 | Okumura |
| 4,540,729 A | 9/1985 | Williams |
| 4,578,295 A | 3/1986 | Jabarin |
| 4,619,956 A | 10/1986 | Susi |
| 4,681,905 A | 7/1987 | Kubota |
| 4,684,679 A | 8/1987 | Kubota |
| 4,812,498 A | 3/1989 | Nakahara |
| 5,251,064 A | 10/1993 | Tennant |
| 5,264,539 A | 11/1993 | Shepherd |
| 5,288,778 A | 2/1994 | Schmitter |
| 5,562,984 A | 10/1996 | Mortlock |
| 5,589,126 A | 12/1996 | Shih |
| 5,731,071 A | 3/1998 | Etchu |
| 5,763,538 A | 6/1998 | Hunter |
| 5,885,709 A | 3/1999 | Wick |
| 6,051,164 A | 4/2000 | Samuels |
| 6,121,389 A | 9/2000 | Kooijmans |
| 6,197,430 B1 | 3/2001 | Asakura |
| 6,224,016 B1 | 5/2001 | Lee |
| 6,274,805 B1 | 8/2001 | Nakazawa |
| 6,388,024 B1 | 5/2002 | VanGaalen |
| 6,441,298 B1 | 8/2002 | Thio |
| 6,498,212 B1 | 12/2002 | Kao |
| 6,503,616 B1 | 1/2003 | Jalan |
| 6,709,731 B2 | 3/2004 | Murschall |
| 6,730,406 B2 | 5/2004 | Murschall |
| 6,838,529 B2 | 1/2005 | Kumazawa |
| 6,881,470 B2 | 4/2005 | Murschall |
| 7,229,697 B2 | 6/2007 | Kliesch |
| 7,241,507 B2 | 7/2007 | Kliesch |
| 7,375,167 B2 | 5/2008 | Natarajan |
| 7,534,487 B2 | 5/2009 | Klein |
| 9,333,692 B2 * | 5/2016 | Brennan .................. C08J 5/18 |
| 9,416,225 B2 * | 8/2016 | Brennan ............. C08G 63/916 |
| 2001/0017429 A1 | 8/2001 | Takahashi |
| 2001/0029274 A1 | 10/2001 | Murschall |
| 2002/0065346 A1 | 5/2002 | Murschall |
| 2002/0099150 A1 | 7/2002 | Kumazawa |
| 2003/0068511 A1 | 4/2003 | Murschall |
| 2003/0170475 A1 | 9/2003 | Kliesch |
| 2003/0219614 A1 | 11/2003 | Kliesch |
| 2005/0137299 A1 | 6/2005 | Berndt |
| 2005/0222345 A1 | 10/2005 | Nakayama |
| 2006/0057408 A1 | 3/2006 | Kliesch |
| 2006/0057409 A1 | 3/2006 | Kliesch |
| 2006/0057490 A1 | 3/2006 | Joo |
| 2006/0263592 A1 | 11/2006 | Kusume |
| 2006/0275593 A1 | 12/2006 | Kern |
| 2007/0065649 A1 | 3/2007 | Matsui |
| 2007/0237972 A1 | 10/2007 | Kliesch |
| 2007/0238816 A1 | 10/2007 | Kliesch |
| 2007/0240075 A1 | 10/2007 | Jesberger |
| 2008/0132631 A1 | 6/2008 | Natarajan |
| 2008/0264484 A1 | 10/2008 | Temchenko |
| 2008/0289680 A1 | 11/2008 | MacFarlane |
| 2008/0302408 A1 | 12/2008 | Bressler |
| 2009/0034235 A1 | 2/2009 | Kusume |
| 2009/0078314 A1 | 3/2009 | Temchenko |
| 2009/0101204 A1 | 4/2009 | Levy |
| 2009/0139564 A1 | 6/2009 | Miyaji |
| 2009/0162589 A1 | 6/2009 | Buchanan |
| 2009/0211621 A1 | 8/2009 | LeBlanc |
| 2009/0275678 A1 | 11/2009 | Kumazawa |
| 2010/0002402 A1 | 1/2010 | Rogers |
| 2010/0071757 A1 | 3/2010 | Krajewski |
| 2010/0120946 A1 | 5/2010 | Kliesch |
| 2010/0215902 A1 | 8/2010 | Kiehne |
| 2010/0229923 A1 | 9/2010 | Frolov |
| 2010/0229924 A1 | 9/2010 | Teranishi |
| 2010/0233843 A1 | 9/2010 | Frolov |
| 2010/0243029 A1 | 9/2010 | Higashi |
| 2010/0258162 A1 | 10/2010 | OBrien |
| 2010/0288353 A1 | 11/2010 | Kliesch |
| 2010/0307570 A1 | 12/2010 | Aoyama |
| 2010/0326517 A1 | 12/2010 | OBrien |
| 2011/0043901 A1 * | 2/2011 | Watanabe ................. B32B 7/02 359/359 |
| 2011/0203643 A1 * | 8/2011 | Watanabe ............ H01L 31/048 136/251 |
| 2011/0284071 A1 * | 11/2011 | Hashimoto ............ B32B 27/08 136/256 |

(56) References Cited

U.S. PATENT DOCUMENTS

| | | | | |
|---|---|---|---|---|
| 2011/0284075 | A1* | 11/2011 | Hatakeyama | H01L 31/049 136/259 |
| 2012/0021197 | A1* | 1/2012 | Matsumura | B32B 27/20 428/213 |
| 2012/0192944 | A1* | 8/2012 | Aoyama | H01L 31/048 136/256 |
| 2012/0227801 | A1* | 9/2012 | Brennan | C08G 63/916 136/256 |
| 2014/0053901 | A1* | 2/2014 | Brennan | H01L 31/048 136/259 |
| 2015/0151474 | A1* | 6/2015 | Brennan | H01L 31/048 525/437 |
| 2016/0233349 | A1 | 8/2016 | Wright | |

FOREIGN PATENT DOCUMENTS

| | | |
|---|---|---|
| EP | 0006686 | 1/1980 |
| EP | 0031202 | 11/1980 |
| EP | 0031203 | 11/1980 |
| EP | 0076582 | 9/1982 |
| EP | 0292251 | 5/1988 |
| EP | 0620245 | 3/1994 |
| EP | 0738749 | 10/1996 |
| EP | 0838500 | 9/1997 |
| EP | 1209200 | 11/2001 |
| EP | 1826826 | 8/2007 |
| EP | 1898470 | 3/2008 |
| EP | 2039507 | 3/2009 |
| EP | 2262000 | 4/2009 |
| EP | 2184312 | 11/2009 |
| EP | 2415599 | 3/2010 |
| EP | 2184311 | 5/2010 |
| EP | 2476552 | 9/2010 |
| EP | 2495284 | 10/2010 |
| GB | 1048068 | 11/1966 |
| GB | 2488787 | 9/2012 |
| JP | 53147018 | 12/1978 |
| JP | 10130482 | 5/1998 |
| JP | 2000007847 | 1/2000 |
| JP | 2000302114 | 10/2000 |
| JP | 2001329043 | 11/2001 |
| JP | 2004165513 | 6/2004 |
| JP | 2005325214 | 11/2005 |
| JP | 2005325216 | 11/2005 |
| JP | 200649541 | 2/2006 |
| JP | 2007208179 | 8/2007 |
| JP | 2009155412 | 7/2009 |
| JP | 2009155478 | 7/2009 |
| JP | 2009188105 | 8/2009 |
| JP | 4501042 | 7/2010 |
| JP | 2010235824 | 10/2010 |
| NL | 6814541 | 10/1969 |
| SU | 192098 | 1/1967 |
| SU | 307091 | 1/1971 |
| WO | 9405645 | 3/1994 |
| WO | 9951659 | 10/1999 |
| WO | 0004073 | 1/2000 |
| WO | 0156966 | 8/2001 |
| WO | 2008001790 | 1/2008 |
| WO | 2009069742 | 6/2009 |
| WO | WO 2011/030098 | * 3/2011 |
| WO | WO 2012/120260 | * 9/2012 |

OTHER PUBLICATIONS

Entire patent prosecution history of U.S. Appl. No. 13/394,623, filed May 31, 2012, entitled, "Hydrolysis Resistant Polyester Films."
Entire patent prosecution history of U.S. Appl. No. 14/003,676, filed Nov. 15, 2013, entitled, "Hydrolysis Resistant Polyester Films."
Final Office Action dated Apr. 28, 2015 for U.S. Appl. No. 14/003,676.
Japanese Office Action in related Japanese Application No. JP2012-528444 dated Oct. 6, 2014.
Lohner, Pierre, International Search Report for International Application No. PCT/GB2010/001698, dated Nov. 16, 2010.
Masson, Patrick, International Preliminary Report on Patentability dated Jun. 5, 2013, for International Application No. PCT/GB2012/000224, 5 pages.
Masson, Patrick, International Search Report dated May 1, 2012, for International Application No. PCT/GB2012/000224, 4 pages.
Momentiv, Technical Data Sheet, Cardura E10P Product Bulletin, Nov. 2012, 3 pages.
Office Action in U.S. Appl. No. 14/003,676, dated Oct. 29, 2014.
Resolution Performance Products, Product Data Sheet, Versatic 10, May 2002, 3 pages.
Russian Office Action dated Jun. 30, 2014 in counterpart Russian Application No. 2012113737, including translation.
Tanaka, "Synthesis and Characterization of Epoxides," Epoxy Resins Chemistry and Technology, May and Dekker (eds.), 1988.
Translation of Russian Decision on Grant of Patent for Invention in Russian Application No. 2012113737/04(020746) dated Nov. 6, 2014.
U.S. Office Action dated May 16, 2014 in U.S. Appl. No. 13/394,623.
U.S. Office Action dated Jul. 7, 2014 in U.S. Appl. No. 14/003,676.
U.S. Office Action dated Sep. 11, 2013 in U.S. Appl. No. 13/394,623.
U.S. Office Action dated Apr. 7, 2015 for U.S. Appl. No. 13/394,623.
Advisory Action dated Jul. 2, 2015 for U.S. Appl. No. 14/003,676.
Office Action dated Aug. 17, 2015 in U.S. Appl. No. 13/394,623.
Advisory Action dated Oct. 23, 2015 in U.S. Appl. No. 13/394,623.
Non Final Office Action dated Jan. 26, 2016 for U.S. Appl. No. 13/394,623.
Kent, "Plastics Profile Extrusion", Rapra Review Reports, vol. 9, No. 8 (1998), p. 10.
Notice of Allowance dated Jan. 20, 2016 for U.S. Appl. No. 14/003,676.
International Search Report and Written Opinion issued in International Application No. PCT/GB2014/052890, dated Nov. 27, 2014.
International Preliminary Report on Patentability issued in related International Application No. PCT/gb2014/052890 dated Apr. 5, 2016.
Notice of Allowance for U.S. Appl. No. 13/394,623, dated Jun. 29, 2016, 9 pages.
Non Final Office Action for U.S. Appl. No. 14/614,518, dated Nov. 10, 2016, 44 pages.
Werner Eberhard et al., "Polyesters, Films", Encyclopedia of Polymer Science and engineering, vol. 12, 1988, pp. 193-216.

* cited by examiner

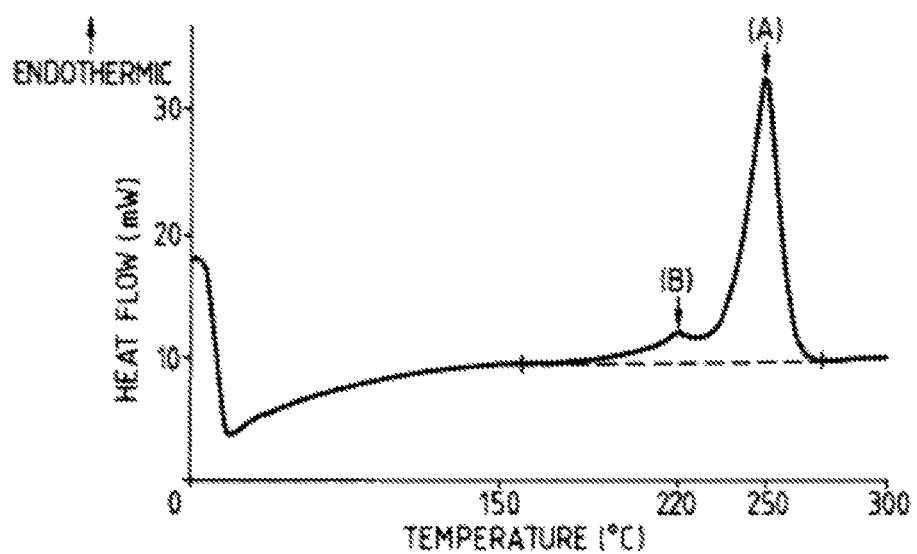

CO-EXTRUDED MULTI-LAYER POLYESTER FILMS HAVING HYDROLYTIC STABILITY AND IMPROVED DELAMINATION RESISTANCE

This application is the National Phase filing of International Application No. PCT/GB2014/052890, filed 23 Sep. 2014, and claims priority of GB Application No. 1317551.8, filed 3 Oct. 2013, the entireties of which applications are incorporated herein by reference.

FIELD OF THE INVENTION

The present invention relates to co-extruded polyester films, to processes for the production thereof, and to uses thereof.

BACKGROUND OF THE INVENTION

The advantageous mechanical properties, dimensional stability and optical properties of polyester films are well-known and are exploited in many areas of technology. Many adaptations of polyester films have been proposed in order to tailor the properties of a polyester film to a particular application. However, it is often found that an adaptation which improves the performance of a polyester film in one respect may be detrimental to the performance of the film in another respect. For instance, a modification to improve the optical properties of a film may have a detrimental effect on the mechanical properties of the film. Accordingly, it is often difficult to obtain polyester films having a suitable combination of desirable properties.

In order to improve the performance of polyester films, it is known to provide multi-layer films having complementary properties so as to form a composite structure. In some cases, multi-layer films may comprise two or more films of the same type in order to improve the mechanical strength of the film or to intensify other functional properties of the film. Alternatively, multi-layer films may comprise two or more films of different types, thereby enabling the properties of the different polyester films to be realised simultaneously. For example, multi-layer polyester films have been used to improve the handling properties of functional polyester films by disposing one or more films having desirable functional properties onto a base film having desirable mechanical properties. Laminated polyester films may suitably be prepared by co-extrusion, coating or lamination techniques However, a disadvantage associated with multi-layer polyester films is that adhesion between layers may be unsatisfactory, which is a particular problem for multi-layer films containing two or more layers of different types. Manipulation of the film, for instance by winding or bending, and/or exposure of the film to moisture or other environmental conditions can lead to delamination of the film layers and to the loss of performance.

The use of elastomeric adhesives in an interposed layer to improve adhesion between the layers of multi-layer polymeric films has been proposed, for instance by EP-A-2039507. In addition, the use of intermediate "tie-layers" in which the intermediate layer comprises components present in each of its adjacent layers as also been shown to improve the delamination resistance of a multi-layer film comprising dissimilar layers. However, such techniques increase the complexity of the film manufacturing process and the intermediate layer can interfere with the mechanical and/or optical properties of the laminated film.

SUMMARY OF THE INVENTION

It is therefore an object of this invention to provide multi-layer polyester films which exhibit excellent hydrolytic stability and improved delamination resistance, particularly while maintaining or improving the ease, efficiency and economy of film manufacture, and without detriment to the mechanical and/or optical properties of the film. It is a particular object of this invention to provide multi-layer polyester films which exhibit improved delamination resistance and excellent or improved hydrolytic stability on exposure to moisture or other environmental conditions, particularly under humid conditions and/or elevated temperatures, and particularly on prolonged exposure over an extended period of time.

According to the present invention, there is provided a co-extruded multi-layer biaxially oriented polyester film comprising a primary polyester layer and a dissimilar secondary polyester layer adjacent to the primary polyester layer, wherein the primary polyester layer and the secondary polyester layer each comprise a glycidyl ester of a branched monocarboxylic acid, wherein the monocarboxylic acid has from 5 to 50 carbon atoms, and wherein said glycidyl ester is present in the form of its reaction product with at least some of the end groups of the polyester.

BRIEF DESCRIPTION OF THE DRAWING

The drawing shows a typical Differential Scanning calorimetry scan obtained for a polyester film according to the invention.

DETAILED DESCRIPTION OF THE INVENTION

Without being bound by theory, it is believed that the glycidyl ester used in the present invention acts as an end-group capper for the polyester by reacting with the carboxyl and/or hydroxyl end-groups of the polyester, and it is believed that the predominant reaction is with the carboxyl end-groups. The glycidyl ester is acting as a hydrolysis stabiliser. It is known that carboxyl end-groups are thought to participate in the mechanisms leading to hydrolytic degradation of polyester films, including polyethylene terephthalate (PET). The inventors are not aware of any prior studies into the role of glycidyl esters in increasing delamination resistance of a multilayer polyester film.

The present inventors have found that the use of glycidyl esters is particularly beneficial in inhibiting the delamination of co-extruded films in which adjacent layers of the film have a different composition. Any effect is less significant in the case where a film comprises adjacent layers of identical composition. Furthermore, the present inventors have found that it is essential that a glycidyl ester be incorporated into both of the adjacent layers. Inclusion of a glycidyl ester component into only one of two adjacent co-extruded film layers is not observed to provide any significant benefit when compared to a corresponding film containing no glycidyl ester component in either layer.

References herein to the secondary polyester layer being "dissimilar" shall be interpreted as meaning that the secondary polyester layer has a different composition to the primary polyester layer. The difference in composition may be due to the chemical composition of the polyester itself and/or due to the presence of additives such as fillers, UV absorbers, pigments and/or antioxidants.

The polyester film is a self-supporting film or sheet by which is meant a film or sheet capable of independent existence in the absence of a supporting base. The primary and secondary polyester layers taken together preferably have a thickness in the range of from about 5 µm to about 500 µm, preferably no more than about 350 µm and more preferably no more than about 250 µm, and preferably at least about 12 µm, more preferably at least about 25 µm, more preferably at least about 50 µm and more preferably at least about 75 µm, and preferably in the range of from about 75 µm to about 250 µm.

The polyester of at least one, and preferably both, of said primary and secondary polyester layers of the co-extruded film is preferably polyethylene terephthalate, which may optionally contain relatively minor amounts of one or more residues derived from other dicarboxylic acids and/or diols. Other dicarboxylic acids include isophthalic acid, phthalic acid, 1,4-, 2,5-, 2,6- or 2,7-naphthalenedicarboxylic acid, 4,4'-diphenyldicarboxylic acid, hexahydro-terephthalic acid, 1,10-decanedicarboxylic acid and aliphatic dicarboxylic acids of the general formula $C_nH_{2n}(COOH)_2$ wherein n is 2 to 8, such as succinic acid, glutaric acid sebacic acid, adipic acid, azelaic acid, suberic acid or pimelic acid. Other diols include aliphatic and cycloaliphatic glycols, such as 1,4-cyclohexanedimethanol. Preferably the polyethylene terephthalate contains only one dicarboxylic acid, i.e. terephthalic acid. Preferably the polyethylene terephthalate contains only one glycol, i.e. ethylene glycol. The polyester is the major component of the primary and secondary polyester layers, and independently makes up at least 50%, preferably at least 65%, and preferably at least 80% by weight of the total weight of each of the primary and secondary polyester layers of the co-extruded film. The polyester may make up at least 85%, at least 90% or at least 95% by weight of the total weight of the primary layer and/or the secondary layer of the co-extruded film.

The intrinsic viscosity of the polyester from which at least one of the primary and secondary polyester layers is manufactured is preferably at least about 0.60 preferably at least about 0.65, preferably at least about 0.70, preferably at least about 0.75, and preferably at least about 0.80. Preferably, both of the primary and secondary polyester layers are manufactured from a polyester having an intrinsic viscosity of at least about 0.60, preferably at least about 0.65, preferably at least about 0.70, preferably at least about 0.75, and preferably at least about 0.80. Preferably, the intrinsic viscosity of the polyester is not more than 0.85, preferably not more than 0.83. Preferably, the intrinsic viscosity of the polyester is at least 0.61. The use of polyesters with a relatively higher intrinsic viscosity provides improved hydrolysis stability, although too high a viscosity can lead to difficulties in film manufacture and/or require specialised, more robust film-forming equipment. For instance, increasing the viscosity too greatly may mean that it is appropriate to reduce output (i.e. reduce the amount of PET extruded per unit time, which leads to a less economical process) or to increase the extrusion temperature in order to reduce the viscosity of the melt (which in turn can lead to thermal degradation of the polymer and the loss of associated properties) in order to achieve stable film production.

Formation of the polyester is conveniently effected in a known manner by condensation or ester interchange, generally at temperatures up to about 295° C. In a preferred embodiment, solid state polymerisation may be used to increase the intrinsic viscosity to the desired value, using conventional techniques well-known in the art, for instance using a fluidised bed such as a nitrogen fluidised bed or a vacuum fluidised bed using a rotary vacuum drier.

The intrinsic viscosity of at least one of the primary and secondary polyester layers is preferably at least 0.65, preferably at least 0.7, and in one embodiment in the range of from about 0.65 to about 0.75.

The polyester of at least one of the primary and secondary polyester layers preferably exhibits an endothermic high temperature peak at a temperature of (A)° C. and an endothermic low temperature peak at a temperature of (B)° C., both peaks being measured by differential scanning calorimetry (DSC), wherein the value of (A–B) is in the range from 15° C. to 50° C., preferably in the range from 15° C. to 45° C., more preferably in the range from 15° C. to 40° C., and in one embodiment in the range from 20° C. to 40° C., and this characteristic may be achieved as disclosed herein by control of the heat-setting temperature for the particular polyester being used. The advantage of exhibiting (A–B) values within the ranges disclosed herein is that a surprising improvement in hydrolytic stability is obtained.

A single glycidyl ester may be used in each of the primary and secondary polyester layers of the co-extruded film, and in such embodiments, the single glycidyl ester used in each of the primary and secondary polyester layers of the co-extruded film is preferably the same. However, in a preferred embodiment a mixture of glycidyl esters is used in one or both of the primary and secondary polyester layers of the co-extruded film. Still more preferably, the same mixture of glycidyl esters is used in each of the primary and secondary polyester layers of the co-extruded film. As used herein, the term "the glycidyl ester" shall be interpreted as referring to "the glycidyl ester component", and thus encompasses embodiments in which a single glycidyl ester is used and those in which a mixture of different glycidyl esters is used.

The glycidyl ester(s) described herein is/are preferably used according to the invention in the absence of other hydrolysis stabilisers (i.e. in the absence of an hydrolysis stabiliser which is not a glycidyl ester of a branched monocarboxylic acid) and in one embodiment in the absence of glycidyl ether compound(s), particularly di- or poly-glycidyl ether compounds.

Suitable glycidyl esters are those derived from branched monocarboxylic acids having from 5 to 50 carbon atoms, preferably from 5 to 25 carbon atoms, preferably from 5 to 15 carbon atoms, preferably from 8 to 12 carbon atoms, preferably from 9 to 11 carbon atoms, and in one embodiment has 10 carbon atoms. The monocarboxylic acid is preferably saturated, i.e. the carbon-carbon bonds in the molecule are all single bonds. Particularly preferred branched monocarboxylic acids include those in which the carbon atom adjacent the carboxylic acid group (hereinafter referred to as the "α-carbon" atom) is a tertiary carbon atom, i.e. it is attached via three carbon-carbon single bonds to three carbon atoms other than the carbon atom of the carboxylic acid group, and each of said three carbon atoms may be part of an alkylene group or an alkyl group. The monocarboxylic acid is preferably a synthetic material, i.e. it is manufactured via organic synthesis comprising at least one synthetic step according to conventional procedures (see for instance WO-01/56966-A1), rather than a naturally occurring material (such as a fatty acid) which may require isolation from a naturally occurring substance.

The glycidyl esters may easily be manufactured by the known reaction of epichlorohydrin with the desired branched monocarboxylic acid. The reaction may be conducted using conventional acidic or basic catalysts, such as alkali metal carboxylates and quaternary ammonium halides, typically at elevated temperatures (temperatures in the range of 50 to 120° C. are typical).

Preferred glycidyl esters include those having the formula (I):

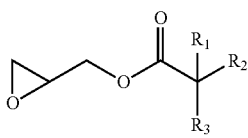

wherein:
$R^1$ and $R^2$ are independently selected from alkyl,
$R^3$ is selected from hydrogen and alkyl, and preferably from alkyl; and wherein the total number of carbon atoms in the groups $R^1$, $R^2$ and $R^3$ is from 3 to 48, preferably from 3 to 23, preferably from 3 to 13, preferably from 6 to 10, preferably from 7 to 9, and in one embodiment is 8.

In preferred embodiments, at least one of $R^1$ and $R^2$ is methyl. More preferably, $R^1$ is methyl and $R^2$ is an alkyl group comprising at least 2 carbon atoms.

In preferred embodiments, a mixture of glycidyl esters may be used in one or both (and preferably both) of the primary and secondary polyester layers of the co-extruded film, wherein each of the glycidyl esters is independently selected according to formula (I), and preferably such that the total number of carbon atoms in the alkyl groups $R^1$, $R^2$ and $R^3$ in each glycidyl ester of the mixture is the same.

In preferred embodiments, $R^1$ is methyl, and $R^2$ and $R^3$ are independently selected from alkyl groups such that the total number of carbon atoms in $R^2$ and $R^3$ is from 2 to 47, preferably from 2 to 22, preferably from 2 to 12, preferably from 5 to 9, preferably from 6 to 8, and in one embodiment the total number of carbon atoms in $R^2$ and $R^3$ is 7. In further embodiments, a mixture of these preferred glycidyl esters is used, preferably such that the total number of carbon atoms in the alkyl groups $R^1$, $R^2$ and $R^3$ in each component of the mixture is the same.

As used herein, the term "alkyl" preferably refers to an unsubstituted straight-chain acyclic hydrocarbon group of formula [—$C_nH_{2n+1}$].

The glycidyl esters described above include chiral compounds. Chiral glycidyl esters may be present as either enantiomer or as a mixture of enantiomers. Generally, any chiral glycidyl esters will be present as a racemic mixture.

The glycidyl ester or mixture of glycidyl esters used in the primary and/or secondary layer of the co-extruded film preferably has a viscosity of less than 100 mPa·s, preferably less than 50 mPa·s, preferably less than 25 mPa·s at 20° C., measured according to ASTM D445.

The glycidyl esters used in the present invention react with the polyester at elevated temperatures, typically between about 160° C. and 300° C., and do so with rapid reaction times, typically much less than 1 second at 290° C. The reaction is a ring-opening addition of the carboxyl or hydroxyl end-groups of the polyester to the oxirane ring of the glycidyl ester and proceeds with zero elimination of by-products, both during manufacture of the modified polyester and during subsequent manufacture and use of the polyester film.

The glycidyl ester component can be introduced at various stages during the film making process, namely:
1. By adding the glycidyl ester during manufacture of the polyester from its monomers. The glycidyl ester is preferably added at the end of the polymerisation process, immediately prior to extrusion of the polyester into pellets. In one embodiment, the modified polyester may then be further treated by solid state polymerisation in order to increase the IV to a desired value.
2. By reacting the glycidyl ester with polyester pellets off-line by melting the pellets, mixing the melt with the additive, then re-extruding the modified polyester into pellets.
3. By adding the glycidyl ester (typically as a liquid) to the polyester pellets prior to or during the introduction of the polyester into the extruder used in the film-manufacturing process (for instance by adding the glycidyl ester to the polyester in the hopper of the extruder). The glycidyl ester and the polyester react in the extruder as the mixture is extruded. Preferably a twin-screw extruder is used.
4. By injecting the glycidyl ester (typically as a liquid) into the molten polyester during the extrusion process (i.e. once the polyester is in the molten state within the extruder, typically a twin-screw extruder, and typically after the polyester has passed through any devolatilisation zone) but prior to the polyester being cast into a film.
5. By adding the glycidyl ester during manufacture of the polyester from its monomers, wherein the polyester is extruded directly into a film. The glycidyl ester is preferably added to the polyester melt at the end of the polymerisation process, immediately prior to extrusion of the polyester into a film.

The glycidyl ester is preferably introduced via one of routes (2) to (5) above, preferably via route (4) or (5). In one embodiment, a masterbatch is produced by adding an excess amount of glycidyl ester, relative to the amount desired in the final film, and this is of particular utility for route (2).

Surprisingly improved product performance is observed using process route (4), and in particular films manufactured by this route demonstrate improved hydrolysis stability, relative to films manufactured using masterbatch technology with route (2) above. It is believed that the relatively late addition of glycidyl ester to the polyester in the extrusion process minimises the increase of carboxyl end-groups caused by thermal degradation during film manufacture. In addition, the advantage of route (4) over the masterbatch route, for example, is that it allows greater use of reclaim film (i.e. waste film from the film manufacturing process, for instance, resulting from "edge-trimming" typically performed after the stenter stage in order to provide a film of uniform width). Reclaimed polyester typically has a lower intrinsic viscosity, and a higher concentration of carboxyl end-groups, than virgin polyester chip and the relatively late addition of the glycidyl ester allows the end-groups of both the virgin and reclaim polyester to be modified. The ability to use higher levels of reclaim while providing improved hydrolysis stability is a particular advantage of the present invention.

The direct extrusion process of route (5) is referred to herein as "coupled polymerisation-film production" or "close-coupled polymerisation-film production". This process dispenses with the intermediate step of pelletisation, and is particularly advantageous. A close-coupled process may be operated with a static or dynamic mixing arrangement between polymerisation reactor and film die, wherein the mixing is effected after addition of the glycidyl ester. Static and dynamic mixing systems are conventional in the art. In a static mixing arrangement, the arrangement of non-moving elements continuously blends the materials as the melt-stream flows through the mixer. Suitable dynamic mixing systems include extruders or other Archimedean screw systems. In a preferred embodiment of the present invention, the close-coupled process is operated with a static mixing arrangement, and it has been surprisingly observed that sufficient mixing to achieve the benefits of the invention can be obtained with only a static mixing arrangement. It is surprising that a close-coupled process applied to this system is able to dispense with dynamic mixing without detriment to the final film properties. In the close-coupled process, an intervening solid state polymerisation step may be, and preferably is, avoided. The close-coupled process reduces the amount of water present in the polymer, thereby avoiding the need for a drying step prior to film formation, and also reducing side reactions between water and the glycidyl ester. The reduced water content allows the intervening solid state polymerisation step to be dispensed with, and allows the polyester film to tolerate a higher carboxyl end-group content without loss of hydrolytic stability. Thus, in this embodiment, the carboxyl end-group content is typically in the range of from about $15 \times 10^{-6}$ to about $50 \times 10^{-6}$ milliequivalents/g (meq/g), more typically from about $20 \times 10^{-6}$ to about $40 \times 10^{-6}$ meq/g, whereas a typical SSP process reduces the carboxyl end-group content to less than about $15 \times 10^{-6}$ meq/g, and typically about $10 \times 10^{-6}$ meq/g. Carboxyl content is determined by titration with sodium hydroxide after dissolution of the polymer in hot benzyl alcohol.

In preferred embodiments, at least one, and preferably both, of the primary and secondary polyester layers of the film further comprises at least one metal cation selected from the group consisting of Group I and Group II metal cations.

Preferably, the reaction of the glycidyl ester with the polyester of at least one, and preferably both, of the primary and secondary polyester layers of the film is carried out in the presence of at least one metal cation selected from the group consisting of Group I and Group II metal cations.

The metal cations are suitably present in at least one, and preferably both, of the primary and secondary polyester layers of the film in an amount sufficient to catalyse the reaction between the hydrolysis stabiliser and at least some of the end-groups of the polyester.

In a preferred embodiment, the amount of the metal cation present in at least one of the primary and secondary polyester layers of the film, and/or present in the reaction mixture during the reaction of the hydrolysis stabiliser with the end-groups of the polyester of at least one of the primary and secondary polyester layers of the film, is at least 10 ppm, preferably at least 15 ppm, at least 40 ppm, preferably at least 45 ppm, preferably at least 65 ppm, preferably at least 80 ppm, and preferably at least 100 ppm by weight, relative to the amount of polyester. Preferably, the amount of the metal cation is not more than about 1000 ppm, preferably not more than about 500 ppm, preferably not more than about 275 ppm, typically not more than about 200 ppm, and in one embodiment not more than about 150 ppm by weight, relative to the amount of polyester. Preferably, the amount of the metal cation is in the range from 45 ppm to 500 ppm, more preferably from 65 ppm to 275 ppm, more preferably from 100 ppm to 200 ppm by weight, relative to the amount of polyester.

As used herein, the terms "Group I" and "Group II" have their conventional chemical meaning and refer to the corresponding Groups in the periodic table. In a preferred embodiment, the metal cations are selected from Group I metal cations, preferably selected from sodium and potassium, and most preferably sodium.

The catalytic effect of the Group I or Group II cation is not dependent on the associated anion, and therefore any appropriate counter-ion may be used. In one embodiment, the anion may be selected from hydroxide, polyacrylate, hydrogen carbonate, carboxylate, chloride, acetate, formate and nitrate. In a preferred embodiment, the anion is selected from hydroxide or polyacrylate. Suitable polyacrylates include those having a molecular weight of from about 1,000 to about 10,000.

The metal cation(s) may be added to the polyester or its monomers prior to or simultaneously with, the addition of the glycidyl ester. Alternatively, the metal cation(s) may be added to the glycidyl ester prior to or simultaneously with the addition of said glycidyl ester to the polyester or its monomers. Preferably, the metal cation(s) are added to the polyester or its monomers, and preferably prior to the addition thereto of the glycidyl ester. In a preferred embodiment, the metal cations are added at the start of the polymerisation reaction to prepare the polyester.

In a preferred embodiment, the primary polyester layer is optically clear or translucent. As used herein, the term "optically clear" refers to a layer that provides a percentage of scattered light in the visible wavelength range of no more than 30%, preferably no more than 15% preferably no more than 10%, preferably no more than 6%, more preferably no more than 3.5% and particularly no more than 1.5%, and/or a total luminous transmission (TLT) for light in the visible region (400 nm to 700 nm) of at least 80%, preferably at least 85%, more preferably at least about 90%. Preferably, an optically clear layer fulfills both of these criteria. As used herein, the term "translucent" refers to a layer having a TLT of at least 50%, preferably at least 60%, and preferably at least 70%.

In a preferred embodiment, the secondary polyester layer comprises a particulate filler material. Particulate fillers are useful to improve handling and windability properties of polyesters films during manufacture. In the context of the present invention, the particulate filler is used primarily to modulate the optical properties of the secondary polyester layer. The particulate filler may, for example, be a particulate inorganic filler, for example metal or metalloid oxides, such as alumina, titania, talc and silica (especially precipitated or diatomaceous silica and silica gels), calcined china clay and alkaline metal salts (such as the carbonates and sulphates of calcium and barium). Any inorganic filler present should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5 µm, more preferably 0.05 to 1.5 µm, and particularly 0.15 to 1.2 µm. Preferably at least 90%, more preferably at least 95% by volume of the inorganic filler particles are within the range of the volume distributed median particle diameter±0.8 µm, and particularly ±0.5 µm. Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile.

The amount of particulate filler incorporated into the secondary polyester layer is suitably in the range of from 0.3 to 30% by weight, based on the weight of polyester in the layer.

In a preferred embodiment, the particulate filler is used as an opacifying agent to increase the opacity of the secondary polyester layer, such that an opaque secondary polyester layer preferably exhibits a Transmission Optical Density (TOD) of at least 0.3, preferably at least 0.4, preferably at least 0.5, preferably at least 0.6, preferably at least 0.7, preferably at least 1.0 and preferably at least 1.5, and in one embodiment preferably at least 2.0, preferably at least 3.0, and preferably at least 4.0. In some embodiments, the particulate filler is selected such that the secondary polyester layer is white, grey or black.

In a preferred embodiment, the particulate filler is selected such that the secondary polyester layer is an opaque white layer. Films according to this embodiment of the invention preferably exhibit a TOD in the range of at least about 0.3, preferably at least about 0.4, preferably at least 0.5, preferably at least 0.6, preferably at least 0.7, and typically no more than about 1.75. Preferred particulate fillers having a whitening effect include particulate inorganic fillers, preferably titanium dioxide and/or barium sulphate. In a preferred embodiment, the particulate inorganic filler in the secondary polyester layer is barium sulphate alone. In the case of a white secondary polyester layer, the amount of filler incorporated into the secondary polyester layer is typically in the range of from about 2% to about 30% by weight, preferably at least about 5% by weight, and preferably from about 10 to about 20% by weight. In a preferred embodiment, the filler is present in an amount of from about 10% to about 25% by weight, and more preferably from about 15% to about 20% by weight, based on the weight of polyester in the layer, and these ranges are particularly suitable for barium sulphate as the opacifying agent. In a further preferred embodiment, the filler is present in an amount of from about 2% to about 20% by weight, more preferably from about 10% to 20% by weight, more preferably from about 10% to about 15%, more preferably from about 12% to about 15% by weight, based on the weight of polyester in the layer, and these ranges are particularly suitable for titanium dioxide as the opacifying agent. A white film preferably exhibits a whiteness index, measured as herein described, in the range of from about 60 to about 120 units.

In an alternative embodiment, the particulate filler is selected such that the secondary polyester layer is an opaque grey or black layer. Films according to this embodiment of the invention typically exhibit a TOD of at least 2.0, more typically at least 3.0, more typically at least 4.0. Preferred particulate fillers having a darkening effect layer include carbon black and metallic fillers, such as aluminium powder. Carbon black is a preferred opacifying agent. In the case of a black or grey secondary polyester layer, the amount of filler incorporated into the secondary polyester layer is typically in the range of from about 0.3% to about 10% by weight, preferably 0.5% to 7% by weight, particularly 1% to 5% by weight, and especially 2% to 4% by weight, based on the weight of the polyester in the layer. The opacifying agent suitably has a mean particle diameter in the range from 0.01 to 1.5 µm, particularly 0.02 to 0.05 µm.

In a further embodiment, the secondary polyester layer may comprise a combination of particulate fillers having and whitening effect with particulate fillers having a darkening effect. Suitable fillers are as described above, and the total amount of fillers in the secondary layer is preferably in the range of from 1% to 30% by weight, preferably 2% to 25% by weight, and more preferably 5% to 20% by weight, based on the weight of polyester in the layer. Films according to this embodiment of the invention typically exhibit a TOD of at least 1.0, more preferably at least 2.0 and more preferably at least 3.0.

In the embodiments of the invention where the secondary polyester layer contains a particulate filler, the primary polyester layer may be free of particulate filler or may contain the same or different type of particulate filler to the secondary polyester layer and/or may contain the same or different amount of particulate filler to the secondary polyester layer. Preferably, where the secondary polyester layer contains a particulate filler, the primary polyester layer is free of particulate filler or contains particulate filler only in minor amounts, for example no more than 2.5% by weight, preferably no more than 2% by weight, preferably no more than 1% by weight, more preferably no more than 0.6% by weight, and in one embodiment no more than about 0.3% by weight, based on the weight of the polyester in the layer. Preferably, the amount of particulate filler in the primary polyester layer is less than the amount of particulate filler in the secondary polyester layer. For instance, the amount of filler in the primary polyester layer is suitably less than 50%, more preferably less than 20% and most preferably less than 10% by weight of the amount of particulate filler in the secondary polyester layer. Suitable particulate fillers, where present, may be selected from the particulate fillers described above. Particulate filler in the primary layer may be derived from filler added into the layer-forming polymer in a conventional manner, or it may be derived from the use of re-claim film. In the present invention, re-claim is optionally added into the primary layer (but preferably not into the secondary layer) and preferably in an amount of up to about 45%, preferably in an amount of from about 30 to about 40%, by weight of the primary layer.

In a preferred embodiment, the secondary polyester layer contains a particulate filler, and the primary polyester layer is optically clear or translucent and is free of particulate filler or contains particulate filler only in minor amounts as described above.

In a further preferred embodiment, the secondary polyester layer contains a particulate filler and is opaque (preferably a white opaque layer), and the primary polyester layer is optically clear or translucent and is free of particulate filler or contains particulate filler only in minor amounts as described above.

In a further preferred embodiment, the secondary polyester layer contains a particulate filler selected from titanium dioxide and/or barium sulphate and is a white opaque layer, and the primary polyester layer is optically clear or translucent and is free of particulate filler or contains particulate filler only in minor amounts as described above.

In a further preferred embodiment, the secondary polyester contains a particulate filler (preferably an inorganic particulate filler, preferably titanium dioxide and/or barium sulphate) in an amount in the range of from about 2% to about 30% by weight, preferably at least about 5% by weight, preferably 10% to 20% by weight, based on the weight of polyester in the layer, as described hereinabove, and the primary polyester layer is optically clear or translucent and is free of particulate filler or contains particulate filler only in minor amounts as described above.

In the preferred embodiments of the invention where the primary polyester layer is optically clear or translucent, any filler in the primary layer is primarily for the purpose of improving handling of the film and is present only in small amounts as described above. For instance, the presence of particulate filler materials improves the windability of the film (i.e. the absence of blocking or sticking when the film is wound up into a roll) is improved, without an unacceptable reduction in haze or other optical properties of the primary layer. Preferred particulate filler materials for use in the optically clear or translucent primary layer include titanium dioxide, silica and/or talc, preferably titanium dioxide and/or silica. When present, such fillers are typically used in only small amounts, generally such that the total weight of filler is not more than about 2.5%, preferably not more than about 2.0%, preferably not more than about 1.0%, more typically no more than about 0.6% and preferably no more than about 0.3% by weight, based on the weight of the polyester in the layer.

In the preferred embodiments of the invention where the secondary polyester layer contains a particulate filler and the primary polyester layer is free of particulate fillers or contains any particulate fillers only in minor amounts as described above, the primary and secondary polyester layers may contain the same polyester material, and preferably do so. Thus, the primary and secondary polyester layers are preferably dissimilar due to the amount of particulate filler in each layer. More preferably, the primary and secondary polyester layers contain the same polyester material and are dissimilar due to both the amount and type of particulate filler in each layer.

The primary polyester layer preferably accounts for greater than 50%, preferably at least 60%, more preferably at least 70% and preferably from about 75% to about 95% of the total thickness of the primary and secondary polyester layers. Thus, the secondary polyester layer preferably accounts for less than 50%, preferably no more than 40%, more preferably no more than 30% and more preferably no more than 25%, and preferably at least 5% more preferably at least 10%, and preferably from about 5% to about 25%, of the total thickness of the primary and secondary polyester layers. These thickness ratios apply particularly to the preferred embodiments of the invention where the secondary polyester layer contains a particulate filler and the primary polyester layer is free of particulate filler or contains any particulate filler only in minor amounts as described above. In this way, the beneficial optical properties of a secondary polyester layer containing a particulate filler material may be obtained without the expense of providing filler throughout the entire film thickness, while the primary polyester layer provides the film with the necessary mechanical strength.

The primary and/or secondary polyester layers optionally comprise a UV-absorber, and preferably at least one of the primary and secondary layers comprises a UV-absorber. Preferably at least the secondary layer comprises a UV-absorber. Compounds suitable for use as UV-absorbers have an extinction coefficient much higher than that of the polyester, such that most of the incident UV light is absorbed by the UV-absorber rather than by the polyester. The UV-absorber generally dissipates the absorbed energy as heat, thereby avoiding degradation of the polymer chain. Typically, the UV-absorber is an organic UV-absorber, and suitable examples include those disclosed in Encyclopaedia of Chemical Technology, Kirk-Othmer, Third Edition, John Wiley & Sons, Volume 23, Pages 615 to 627. Particular examples of UV-absorbers include benzophenones, benzotriazoles (U.S. Pat. No. 4,684,679, U.S. Pat. No. 4,812,498 and U.S. Pat. No. 4,681,905), benzoxazinones (U.S. Pat. No. 4,446,262, U.S. Pat. No. 5,251,064 and U.S. Pat. No. 5,264,539) and triazines (U.S. Pat. No. 3,244,708, U.S. Pat. No. 3,843,371, U.S. Pat. No. 4,619,956, U.S. Pat. No. 5,288,778 and WO 94/05645). The UV-absorber may be incorporated into the film according to one of the methods described herein. In one embodiment, the UV-absorber may be chemically incorporated in the polyester chain. EP-A-0006686, EP-A-0031202, EP-A-0031203 and EP-A-0076582, for example, describe the incorporation of a benzophenone into the polyester chain. The specific teaching of the aforementioned documents regarding UV-absorbers is incorporated herein by reference. In a particularly preferred embodiment, improved UV-stability in the present invention is provided by triazines, more preferably hydroxyphenyltriazines, and particularly hydroxyphenyltriazine compounds of formula (II):

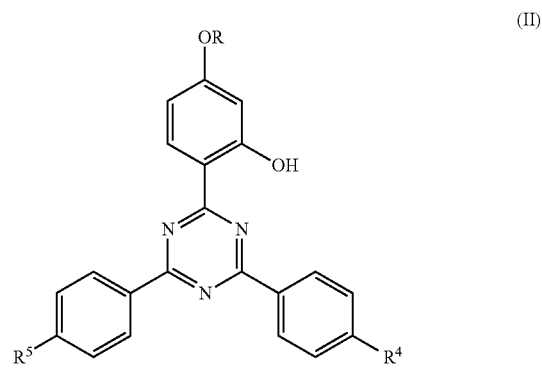

wherein R is hydrogen, $C_1$-$C_{18}$ alkyl, $C_2$-$C_6$ alkyl substituted by halogen or by $C_1$-$C_{12}$ alkoxy, or is benzyl and $R^4$ and $R^5$ are independently selected from hydrogen, alkyl, alkoxy or phenyl. R is preferably $C_1$-$C_{12}$ alkyl or benzyl, more preferably $C_3$-$C_6$ alkyl, and particularly hexyl. $R^4$ and $R^5$ are preferably hydrogen. An especially preferred UV-absorber is 2-(4,6-diphenyl-1,3,5-triazin-2-yl)-5-(hexyl)oxy-phenol, which is commercially available as Tinuvin™ 1577 from BASF, and which is a compound of formula (II) above, wherein R is $C_6H_{13}$ and $R^4$ and $R^5$ are both H. A further especially preferred UV-absorber is 2-(2'-hydroxyphenyl)-4,6-diphenyl triazine which is commercially available as Tinuvin™ 1600 from BASF, and which is a triazine of formula (II) above, wherein R is $CH_2CH(C_2H_5)C_4H_9$, $R^4$ is phenyl and $R^5$ is hydrogen.

The amount of UV-absorber in the primary and/or secondary polyester layer is preferably in the range from 0.1% to 10%, more preferably 0.2% to 7%, more preferably 0.6% to 4%, particularly 0.8% to 2%, and especially 0.9% to 1.2% by weight, relative to the total weight of the layer.

The primary and/or secondary polyester layer of the film may optionally comprise an anti-oxidant. A range of anti-oxidants may be used, such as antioxidants which function by trapping radicals or by decomposing peroxide. Suitable radical-trapping antioxidants include hindered phenols, secondary aromatic amines and hindered amines, such as Tinuvin™ 770 (Ciba-Geigy). Suitable peroxide-decomposing antioxidants include trivalent phosphorous compounds, such as phosphonites, phosphites (e.g. triphenyl phosphate and trialkylphosphites) and thiosynergists (e.g. esters of thiodipropionic acid, such as dilauryl thiodipropionate). Hindered phenol antioxidants are preferred. A particularly preferred hindered phenol is tetrakis-(methylene 3-(4'-hydroxy-3', 5'-di-t-butylphenyl propionate) methane, which is commercially available as Irganox™ 1010 (Ciba-Geigy). Other suitable commercially available hindered phenols include Irganox™ 1035, 1076, 1098 and 1330 (Ciba-Geigy), Santanox™ R (Monsanto), Cyanox™ antioxidants (American Cyanamid) and Goodrite™ antioxidants (BF Goodrich). The concentration of antioxidant present in the primary and/or secondary polyester layer of the film is preferably in the range from 50 ppm to 5000 ppm, more preferably in the range from 300 ppm to 1500 ppm, particularly in the range from 400 ppm to 1200 ppm, and especially in the range from 450 ppm to 600 ppm based on the weight of the polyester. A mixture of more than one antioxidant may be used, in which case the total concentration thereof is preferably within the aforementioned ranges. Incorporation of the antioxidant into the polyester may be effected by conventional techniques, and preferably by mixing with the monomeric reactants from which the polyester is derived, particularly at the end of the direct esterification or ester exchange reaction, prior to polycondensation.

The primary and/or secondary polyester layer of the film may further comprise any other additive conventionally employed in the manufacture of polyester films. Thus, additives such as cross-linking agents, dyes, pigments, voiding agents, lubricants, radical scavengers, thermal stabilisers, flame retardants and inhibitors, anti-blocking agents, surface active agents, slip aids, gloss improvers, prodegradents, viscosity modifiers and dispersion stabilisers may be incorporated as appropriate. Such components may be introduced into the polymer in a conventional manner. For example, by mixing with the monomeric reactants from which the film-forming polymer is derived, or the components may be mixed with the polymer by tumble or dry blending or by compounding in an extruder, followed by cooling and, usually, comminution into granules or chips. Masterbatching technology as described above may also be employed.

The total amount of glycidyl ester present in the multi-layer film is preferably in the range of from about 0.2 to about 5 mol %, more preferably from about 0.2 to about 2.0 mol %, more preferably from about 0.3 to about 1.5 mol %, more preferably from about 0.5 to about 1.0 mol %, based on the amount of polyester in the film. The inventors have found that if too much glycidyl ester is incorporated into the film, the intrinsic viscosity may be reduced, the film may be become discoloured (yellowness) and brittle, and film formation may become difficult.

The glycidyl ester is preferably present in each of the primary and secondary polyester layers in an amount that is independently in the range of from about 0.1 to about 5 mol %, more preferably from about 0.15 to about 2.5 mol %, more preferably from about 0.15 to about 2.0 mol %, more preferably from about 0.15 to about 1.5 mol %, more preferably from about 0.15 to about 1.2 mol %, more preferably from about 0.15 to about 1.0 mol %, based on the amount of polyester in the respective layer. Within these ranges, the secondary polyester layer preferably comprises at least about 0.65 mol %, preferably at least about 0.70 mol %, preferably at least about 0.80 mol % of glycidyl ester. Within these ranges, the primary polyester layer preferably comprises at least about 0.10 mol %, preferably at least about 0.15 mol %, preferably at least about 0.30 mol %, and preferably no more than about 0.80 mol %, preferably no more than about 0.70 mol %, and preferably no more than about 0.65 mol %, of glycidyl ester.

Particularly in the case where the primary and/or secondary polyester layer has a relatively high content of particulate filler materials (for instance, at least 5%, 10% or 15% by weight, as described hereinabove), it is preferred that the secondary polyester layer comprises a relatively higher content of glycidyl ester and the primary polyester layer comprises a relatively lower content of glycidyl ester. Preferably, said secondary polyester layer comprises at least about 0.65 mol %, preferably at least about 0.70 mol %, preferably at least about 0.80 mol %, and preferably no more than about 1.5 mol %, preferably no more than about 1.2 mol %, preferably no more than about 1.0 mol % of glycidyl ester, based on the amount of polyester in the layer. Preferably, the primary polyester layer comprises at least about 0.1 mol %, preferably at least about 0.15 mol %, preferably at least about 0.30 mol %, and preferably no more than about 0.80 mol %, preferably no more than about 0.70 mol %, and preferably no more than about 0.65 mol %, based on the amount of polyester in the layer.

In the case where the secondary polyester layer has a relatively high content of particulate filler materials (for instance, at least 5%, 10% or 15% by weight, as described hereinabove), and where the primary polyester layer is free of, or contains only minor amounts (as defined above) of particulate filler materials, the secondary polyester layer advantageously comprises a relatively higher content of the glycidyl ester and the primary polyester layer comprises a relatively lower content of the glycidyl ester. In a preferred embodiment, the primary polyester layer comprises at least about 0.1 mol %, preferably at least about 0.15 mol %, preferably at least about 0.3 mol %, and preferably no more than about 0.80 mol %, preferably no more than about 0.70 mol %, preferably no more than 0.65 mol %, of glycidyl ester based on the amount of polyester in the primary layer, and the secondary polyester layer preferably comprises a greater amount in the range of from about 0.65 to about 5 mol %, preferably at least about 0.70 mol %, preferably at least about 0.80 mol %, and preferably no more than about 1.5 mol %, preferably no more than about 1.2 mol %, preferably no more than about 1.0 mol %, of glycidyl ester, based on the amount of polyester in the secondary layer.

Preferably, the multi-layer films of the present invention are defined by the ratio of the concentration of the glycidyl ester in the secondary layer $[GE_S]$ to the concentration of the glycidyl ester in the primary layer $[GE_P]$. Preferably, the concentration of the glycidyl ester in the secondary layer $[GE_S]$ is greater than the concentration of the glycidyl ester in the primary layer $[GE_P]$. Preferably, $[GE_S]:[GE_P]$ is at least 1.2:1, preferably at least 1.3:1, preferably at least 1.4:1, and preferably no more than 10.0:1, in order to provide the combination of excellent delamination resistance with excellent hydrolysis resistance.

The inventors have unexpectedly found that delamination resistance is a function of both the relative ratio $[GE_S]:[GE_P]$ and the overall concentration of glycidyl ester in the multilayer film $[GE_O]$. According to the present invention, it is preferred that $([GE_S]/[GE_P]) \times [GE_O]$ is at least 0.6, preferably at least 0.7, preferably at least 0.8, preferably at least 1.0, preferably at least 1.2, preferably at least 1.4. As discussed hereinbelow, the delamination resistance is preferably measured by retention of interlayer peel strength $(R_{IPS})$ after 60 hours at 121° C. and 1.2 bar pressure and 100% relative humidity.

The co-extruded polyester film of the invention preferably exhibits a low shrinkage, preferably less than 3%, preferably less than 2%, preferably less than 1.5%, and preferably less than 1.0% at 150° C. over 30 minutes, particularly in the machine (longitudinal dimension) of the film. Preferably such low shrinkage values are exhibited in both dimensions of the film (i.e. the longitudinal and transverse dimensions).

As well as improved delamination resistance, the polyester films of the present invention exhibit a high level of film uniformity and quality, as well as resistance to hydrolytic degradation. In particular, the films of the present invention have a low level profile defects and/or die-lines, uniform thickness and light transmission properties, and excellent processability, with no defects or breakage in the film web.

Formation of the polyester film may be effected by conventional co-extrusion techniques well-known in the art. In general terms the process comprises the steps of co-extruding the primary and secondary polyester compositions through independent orifices of a multi-orifice die, and thereafter uniting the still molten layers or, preferably, by single-channel co-extrusion in which molten streams of the respective polyesters are first united within a channel leading to a die manifold, and thereafter extruded together from the die orifice under conditions of streamline flow without intermixing thereby to produce a laminated film. The extrusion is generally carried out at a temperature within the range of from about 280 to about 300° C., and is followed by quenching the extrudate and orienting the quenched extrudate.

Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the Tg of the polyester, preferably about 15° C. higher than the Tg. Greater draw ratios (for example, up to about 8 times) may be used if orientation in only one direction is required. It is not necessary to stretch equally in the machine and transverse directions although this is preferred if balanced properties are desired.

The stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction (TD) by a procedure known as "toe-in". Toe-in can involve dimensional shrinkage of the order 2 to 4% but an analogous dimensional relaxation in the process or machine direction (MD) is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable. In one embodiment, the heat-set-temperature is within the range of from about 200 to about 225° C., which provides unexpected improvements in hydrolytic stability. After heat-setting the film is typically quenched rapidly in order induce the desired crystallinity of the polyester.

The film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The film described hereinabove may have one or more additional layers disposed on one or both surfaces thereof. Additional layers may be provided, for instance, to provide additional mechanical strength or to provide one or more layers having desirable optical, conductive, heat resistant, lubricating, adhesive, adhesion-promoting or other properties. For example, an additional layer may be used so as to provide a functional layer the primary polyester layer, such that the primary polyester layer functions essentially as a structural element, providing support for the functional layer provided thereon. The one or more additional layers may be formed by simultaneous co-extrusion with the primary and secondary polyester layers to produce a multi-layer film, which may be oriented and heat-set as hereinbefore described. Other methods of forming said one or more additional layers include the lamination of one or more pre-formed layers to the co-extruded film of the invention, and the coating of one or both surfaces of the film of the invention with a film-forming coating. Coating may be effected using any suitable coating technique, including gravure roll coating, reverse roll coating, dip coating, bead coating, extrusion-coating, melt-coating or electrostatic spray coating. Any coating step preferably avoids the use of organic solvent. The coating step may be conducted "in-line" (i.e. wherein the coating step takes place during film manufacture and before, during or between any stretching operation(s) employed) or "off-line" (i.e. after film manufacture), and is preferably conducted in-line. Any additional layer is preferably selected from the polyesters derived from the dicarboxylic acids and diols described hereinabove, and preferably from PET or PET-based polyesters. Any additional layer may comprise any of the additives mentioned above, particularly one or more additives independently selected from hydrolysis stabiliser(s), UV-absorber(s), anti-oxidant(s) and particulate inorganic filler(s), wherein the additive(s) in any additional layer may be the same as or different to any such additive in the film of the present invention described hereinabove. Any additional layer preferably has a thickness in the range of from about 50 µm to about 500 µm, more preferably no more than about 250 µm, and typically between about 100 µm and 250 µm, preferably between about 100 µm and 150 µm.

Where an additional layer is used, it is preferably a polyester layer provided on the surface of the primary polyester layer opposite the secondary polyester layer. Preferably, the additional polyester layer is dissimilar to the primary polyester layer and comprises a glycidyl ester component as described above. In a preferred embodiment, an additional polyester layer is provided on the surface of the primary polyester layer opposite the secondary polyester layer, wherein the additional polyester layer has the same composition as the secondary polyester layer.

Additionally or alternatively to the additional layers described hereinabove, the multilayer film of the present invention may comprise a primer layer, for instance an adhesion-promoting layer to improve adhesion of the multilayer film of the present invention to a subsequently applied layer, such as said additional layer described above. A primer layer may be applied to either one or both of the surfaces of the primary layer and/or and secondary layer, and is suitable applied to the primary layer. A primer layer is preferably applied by a coating technique, and preferably by an in-line coating technique. Primer layers are preferably no more than 1 µm in thickness, preferably less than 500 nm, and preferably in the range of from about 10 to about 300 nm in thickness.

The film of the present invention is intended and adapted for use in any environment in which hydrolytic stability is critical, for instance under humid conditions and elevated temperatures, and in exterior applications. The films of the present invention are particularly suitable for use in photovoltaic (PV) cells. A PV cell is a multilayer assembly typically comprising a front-plane, electrode layers, a photovoltaic-active layer, and a back-plane. Dye-sensitised PV cells are of particular interest, in which the active light-absorbing layer comprises a dye which is excited by absorbing incident light. The film of the present invention is of particular use as, or as a layer present in, the front-plane or the back-plane of the PV cell, particularly the back-plane.

According to a further aspect of the present invention, there is provided a PV cell comprising a front-plane (which may be a flexible polymeric front-plane or a glass front-plane), one or more electrode layers, a photovoltaic-active layer, and a back-plane, typically wherein the electrode layers and photovoltaic-active layer are encapsulated in an a suitable encapsulant (such as an ethylene vinyl acetate (EVA) resin matrix) as is known in the art, and wherein the back-plane comprises a co-extruded multi-layer film of the present invention.

Particularly preferred PV cells in accordance with the present invention include those in which the secondary polyester layer is an opaque, white layer, preferably wherein the secondary polyester layer comprises a particulate filler as described above such that the secondary polyester layer is an opaque white layer. In a more preferred embodiment, the secondary polyester layer is an opaque, white layer containing a particulate filler as described above, and the primary polyester layer is optically clear as defined above.

In such a PV cell, the film of the invention is preferably present in the PV cell as a back-plane, with the primary polyester layer adjacent to the encapsulated photovoltaic-active layer and the secondary polyester layer outermost. The primary polyester layer may be laminated to the photovoltaic-active layer by any suitable technique, for instance using an adhesive such as EVA.

According to a further aspect of the present invention, there is provided the use of a co-extruded multi-layer film as defined herein as a back-plane in a photovoltaic cell.

According to a further aspect of the present invention, there is provided a process for the manufacture of a co-extruded multi-layer biaxially oriented polyester film comprising a primary polyester layer and a dissimilar secondary polyester layer, wherein the process comprises:
(i) co-extruding, preferably at a temperature in the range of from about 280° C. to 300° C., a primary polyester composition and a dissimilar secondary polyester composition, wherein the primary polyester composition and the secondary polyester composition each comprise a glycidyl ester of a branched monocarboxylic acid, wherein the branched monocarboxylic acid has from 5 to 50 carbon atoms, and wherein the glycidyl ester is present in the co-extrudate in the form of its reaction product with at least some of the end groups of the polyester;
(ii) quenching the co-extrudate;
(iii) stretching the quenched co-extrudate in two mutually perpendicular directions: and
(iv) heat-setting the film, preferably at a temperature in the range of from about 200° C. to about 225° C.

Preferably, step (i) comprises co-extruding the primary and secondary polyester compositions through independent orifices of a multi-orifice die, and thereafter uniting the still molten layers or, preferably, by single-channel co-extrusion in which molten streams of the respective polyesters are first united within a channel leading to a die manifold, and thereafter extruded together from the die orifice under conditions of streamline flow without intermixing thereby to produce a multi-layer film.

According to a further aspect of the present invention, there is provided a method of improving the delamination resistance, and particularly of improving the delamination resistance over a prolonged period in humid conditions at elevated temperatures, of a co-extruded multi-layer biaxially oriented polyester film comprising a primary polyester layer and a dissimilar secondary polyester layer, the method comprising providing the polyester of each of the primary and secondary polyester layers such that at least some of the end-groups of said polyester are in the form of their reaction product with a glycidyl ester of a branched monocarboxylic acid, wherein the branched monocarboxylic acid has from 5 to 50 carbon atoms, as described hereinabove.

According to a further aspect of the present invention, there is provided the use of a glycidyl ester of a branched monocarboxylic acid, wherein the branched monocarboxylic acid has from 5 to 50 carbon atoms, for improving the delamination resistance, and particularly for improving the delamination resistance over a prolonged period in humid conditions at elevated temperatures, of a co-extruded multi-layer biaxially oriented polyester film comprising a primary polyester layer and a dissimilar secondary polyester layer, wherein the glycidyl ester is present in both the primary polyester layer and the secondary polyester layer in the form of its reaction product with at least some of the end groups of the polyester.

As used herein, the term "improving the delamination resistance of a multi-layer polyester film" means improving the delamination resistance relative to a multi-layer polyester film which is not made according to the invention, i.e. without said glycidyl ester in both layers in the preferred quantities described herein. Preferably, "improving the delamination resistance" means increasing the retention of interlayer peel strength of the multi-layer film, particularly over a prolonged period in humid conditions at elevated temperatures. Preferably, the interlayer peel strength after 60 hours at 121° C. and 1.2 bar pressure and 100% relative humidity is at least about 0.5 N, preferably at least about 0.75 N. Preferably, the retention of interlayer peel strength after 60 hours at 121° C. and 1.2 bar pressure and 100% relative humidity is at least about 30%, preferably at least about 40%, preferably at least about 50%, where retention of interlayer peel strength $R_{IPS}$ is defined as:

$$R_{IPS}=(IPS_T/IPS_0)\times 100$$

where $IPS_0$ and $IPS_T$ are the interlayer peel strength values measured prior to the accelerated ageing test and after accelerated ageing for 60 hours at 121° C. and 1.2 bar pressure and 100% relative humidity (for instance, in an autoclave), respectively.

As used herein, the term "prolonged period in humid conditions at elevated temperatures" refers to the environmental conditions which the film experiences during use, for instance as a PV cell, and preferably as measured by an accelerated ageing test over a period of at least 60 hours, preferably at least 64 hours, preferably at least 68 hours, preferably at least 72 hours, preferably at least 76 hours, preferably at least 80 hours, preferably at least 84 hours, preferably at least 88 hours and more preferably at least 92 hours at 121° C. and 1.2 bar pressure and 100% relative humidity, for instance in an autoclave.

The films of the present invention preferably exhibit simultaneously both of:
  (i) an interlayer peel strength after 60 hours at 121° C. and 1.2 bar pressure and 100% relative humidity of at least 0.5 N, preferably at least about 0.75 N, and/or a retention of interlayer peel strength ($R_{IPS}$) after 60 hours at 121° C. and 1.2 bar pressure and 100% relative humidity of at least about 30%, preferably at least about 40%, preferably at least about 50%; and
  (ii) a hydrolysis resistance at 121° C. and 1.2 bar pressure and 100% relative humidity such that the elongation to break (ETB) of the film is at least 10% after at least 60 hours, preferably at least 64 hours, preferably at least 68 hours, preferably at least 72 hours, preferably at least 76 hours, preferably at least 80 hours, preferably at least 84 hours, preferably at least 88 hours and more preferably at least 92 hours under said conditions.

Property Measurement

The following analyses were used to characterize the films described herein:
(i) Clarity was evaluated by measuring total luminance transmission (TLT) and haze (% of scattered transmitted visible light) through the total thickness of the film using an M57D spherical hazemeter (Diffusion Systems) according to the standard test method ASTM D1003.
(ii) Transmission Optical Density (TOD) was measured using a Macbeth Densitometer TR 927 (obtained from Dent and Woods Ltd, Basingstoke, UK) in transmission mode.
(iii) Whiteness index was measured using a Colorgard System 2000, Model/45 (manufactured by Pacific Scientific) and the principles of ASTM D 313.
(iv) Intrinsic viscosity (in units of dL/g) of the polyester and polyester film was measured by solution viscometry in accordance with ASTM D5225-98(2003) on a Viscotek™ Y-501C Relative Viscometer (see, for instance, Hitchcock, Hammons & Yau in *American Laboratory* (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta=0.25\eta_{red}+0.75(\ln \eta_{rel})/c$$

wherein:
  $\eta$=the intrinsic viscosity (in dL/g),
  $\eta_{rel}$=the relative viscosity,
  c=the concentration (in g/dL), &
  $\eta_{red}$=reduced viscosity (in dL/g), which is equivalent to $(\eta_{rel}-1)/c$ (also expressed as $\eta_{sp}/c$ where $\eta_{Sp}$ is the specific viscosity).
(v) The hydrolysis resistance of the film was assessed by accelerated aging in an autoclave testing. Samples of the film are cut into strips 10 mm wide and placed in an autoclave operating at 121° C. and 1.2 bar pressure and 100% relative humidity. The test is conducted using water in excess to achieve a saturated vapour. Properties relating to the aging of the polymer were then measured at various time intervals. In particular, the tensile strength (brittleness) of the polyester film was measured as the elongation to break (ETB) of the film. An ETB value of over 100% is typically exhibited by a film which has not been aged. In general, a film remains useful in its end-use up to the time at which its ETB is reduced to less than 10%. The preferred films of the present invention exhibit an ETB of at least 10%, after at least 80 hours, preferably at least 84 hours, preferably at least 88 hours and more preferably at least 92 hours at 121° C. and 1.2 bar pressure in the accelerated ageing test described herein. The ETB characteristics referred to herein are particularly applicable to the machine or longitudinal direction of the film (MD).
(vi) Elongation to break is measured according to test method ASTM D882. Using a straight edge and a calibrated sample cutter (10 mm+\−0.5 mm) five strips (100 mm in length) of the film are cut along the machine direction. Each sample is tested using an Instron model 3111 materials test machine, using pneumatic action grips with rubber jaw faces. Temperature (23° C.) and relative humidity (50%) are controlled. The crosshead speed (rate of separation) is 25 mm·min$^1$. The strain rate is 50%. It is calculated by dividing the rate of separation by the initial distance between grips (sample length). The equipment records the elongation at break of each sample. The elongation to break ($\epsilon_B$ (%)) is defined as:

$$\epsilon_B(\%)=(\text{extension at break}/L_0)\times 100$$

where $L_0$ is the original length of the sample between grips.
(vii) The polyester film was tested for weatherability according to ISO 4892-2.
(viii) Thermal shrinkage was assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.

(ix) Differential scanning calorimeter (DSC) scans were obtained using a Perkin Elmer DSC 7 instrument. Polyester film samples weighing 5 mg were encapsulated into a standard Perkin Elmer aluminium DSC crucible. The film and crucible were pressed flat to ensure that the film was partially constrained in order to minimise effects of relaxation of orientation during heating. The specimen was placed in the sample holder of the instrument and heated at 80° C. per minute from 30 to 300° C. to record the relevant trace. A dry, inert purge gas (nitrogen) was used. The temperature and heat flow axis of the DSC instrument were fully calibrated for the experimental conditions, i.e. for the heating rate and gas flow rate. The values for the peak temperatures, i.e. the endothermic high temperature peak (A) and endothermic low temperature peak (B), were taken as the maximum displacement above a baseline drawn from the onset of each endothermic melting process to the end of each endothermic melting process. Peak temperature measurements were derived using standard analysis procedures within the Perkin Elmer software. Precision and accuracy of the measurements was ±2° C. A sample plot is shown in the drawing.

(x) The amount of hydrolysis stabiliser in the final film is measured by $^1$H NMR (D2-1,1,2,2-tetrachloroethane as solvent; GSX-Delta 400 instrument at 80° C.).

(xi) Delamination resistance was assessed by measuring the interlayer peel strength, which is the force required to separate the two coextruded layers of the multilayer films of the present invention. A sample of film (10 mm wide; 290 mm long) was cut from the web. A score mark was made across the sample on the side of the film presenting the secondary layer, approximately 10 mm from one end of the sample, deep enough to cut through the secondary layer, but not so deep as to cut into the primary layer. The 10 mm tab of film was pulled backwards repeatedly to initiate delamination of the two layers. The free ends of the two layers are then manually peeled apart over a short distance (approx. 15 mm) to create a suitable test specimen. Such partially separated samples are placed into a mechanical testing apparatus (Instron, model 3111), the primary layer being inserted into the top jaw and the secondary layer being inserted into the bottom jaw of the apparatus. The two layers, which are still conjoined, are peeled apart by the apparatus at a rate of 50 mm/min. The maximum load required to separate the samples is recorded over a 20 mm test length, and this is designated the interlayer peel strength. The test is repeated several times to obtain a statistically relevant average and variance. The retention of interlayer peel strength is measured after 60 hours at 121° C. and 1.2 bar pressure and 100% relative humidity, for instance in an autoclave as described above for hydrolysis resistance.

The invention is illustrated by reference to the drawing, a typical DSC scan (heat flow versus temperature) obtained for a polyester film according to the invention. The peak marked (A) in the drawing is the endothermic high temperature peak having a value of 250° C., and the peak marked (B) is the endothermic low temperature peak having a value of 220° C., and so the value (A–B) is (250–220)= 30° C.

The invention is further illustrated by reference to the following examples. The examples are not intended to limit the scope of the invention as described above.

EXAMPLES

A series of films comprising two layers was extruded and cast using a standard melt coextrusion system. The coextrusion system was assembled using two independently operated extruders which fed separate supplies of polymeric melt to a standard coextrusion block or junction at which these streams were joined. The primary layer comprised a PET polyester P1, and the secondary layer comprised a PET polyester P2.

PET polyester P1 had an intrinsic viscosity of 0.79 (measured on the polymer chip). The P1 polyester contained $TiO_2$ in an amount of 0.25 wt % by weight of the polyester, as well as $SiO_2$ in an amount of 0.25 wt % by weight of the polyester. The P1 polyester further contained Dispex™ G40 (Ciba/BASF; sodium salt of an acrylic copolymer; supplied as a 40% solids aqueous dispersion) in amounts of 500 ppm (by weight relative to the final weight of the polymer produced), which was added at the start of the polymerisation process, along with the terephthalic acid and ethylene glycol. The P1 polyester further contained 500 ppm Irganox™ 1010 (Ciba-Geigy) by weight of the polyester.

PET polyester P2 had an intrinsic viscosity of 0.81 (measured on the polymer chip). The P2 polyester contained $BaSO_4$ in an amount of 18 wt % by weight of the polyester, 500 ppm Dispex™ as well as Tinuvin™ 1577 in an amount of 1.0 wt % by weight of the polyester.

Cardura™ E10P (Hexion Specialty Chemicals, Ohio, US; density 0.97 g/cm$^3$) was metered into the PET chip conveying system prior to introduction into the extruder, at varying flow-rates between 0 and 10 ml/kg/hr, in order to provide the respective layers of the final film with hydrolysis stabiliser in varying amounts (see Table 1 below). The flow rate of the PET was 1382 kg/hr.

The melt-streams were thereafter transported to a simple, flat film extrusion die which allowed the melt curtain to be cast from the common coextrusion die at 285° C., and then quenched in temperature onto a rotating, chilled metal drum. The cast film was collected at a process speed of about 12.25 m/min and was approximately 1200 mm in width. The cast extrudate was stretched in the direction of extrusion to approximately 3.1 times its original dimensions at a temperature of 85° C. The cooled stretched film was then passed into a stenter oven at a temperature of 110° C. where the film was dried and stretched in the sideways direction to approximately 3.1 times its original dimensions. The biaxially stretched film was heat-set at temperatures in the range of from 200 to 220° C. The final thicknesses of the primary and secondary layers in the resulting films are shown in Table 1 below.

The hydrolysis resistance of the films was assessed by measuring elongation to break before and after accelerated ageing, as described herein. The results are shown in Tables 1 and 2 below. Delamination resistance was assessed by measuring the interlayer peel strength, and the retention thereof after accelerated ageing, using the methods described herein and the results are shown in Table 1 below.

The coextruded film of Examples 1- to 10 exhibited an optical density of 0.38 to 0.73 and a whiteness index of 62 to 74.

The results demonstrate that the presence of the glycidyl ester provides a multi-layer polyester film having excellent hydrolysis resistance and delamination resistance. In particular, the data further demonstrate that when the glycidyl ester is present in amounts of at least 0.65 mol % in the secondary layer, the delamination resistance is unexpectedly improved.

In all of the Examples according to the invention described above, the film uniformity and film quality were excellent, with a very low level of die-lines or profile defects; there was no odour detected around the film die; and all films demonstrated good processability.

TABLE 1

| | | Primary Layer | | Secondary Layer | | Overall | Ratio of Cardura | Hydrolysis | Initial interlayer | Retained Peel Strength after |
|---|---|---|---|---|---|---|---|---|---|---|
| Ex. | Sample | Cardura conc./mol % | Thickness/ μm | Cardura conc./mol % | Thickness/ μm | Cardura conc./mol % | conc. P2/P1 | resistance/hrs to ETB <10% | peel strength/N | 60 hrs accel. ageing/N |
| 1 | H43-1 V1 | 0.44 | 85.3 | 0.65 | 40.1 | 0.50 | 1.48 | 100 | 1.88 | 46.5 |
| 2 | H43-1 V3 | 0.54 | 82.3 | 0.74 | 42.3 | 0.60 | 1.37 | 88 | 1.87 | 46.0 |
| 3 | H43-1 V4 | 0.51 | 74.3 | 1.07 | 41.6 | 0.64 | 2.10 | 92 | 1.69 | 49.8 |
| 4 | H43-1 V6 | 0.40 | 72.1 | 0.98 | 44.5 | 0.60 | 2.45 | 80 | 2.55 | 89.8 |
| 5 | H43-2 V3 | 0.17 | 96.2 | 0.91 | 30.7 | 0.36 | 5.35 | 80 | 1.76 | 59.2 |
| 6 | H43-2 V13 | 0.10 | 97.9 | 0.82 | 28.1 | 0.27 | 8.20 | 72 | 1.22 | 104.1 |
| 7 | H43-1 V0 | 0.00 | 90.3 | 0.00 | 38.6 | 0.00 | 0.00 | 72 | 2.20 | 6.4 |
| 8 | H43-2 V3B | 0.24 | 99.3 | 0.53 | 27.0 | 0.29 | 2.21 | 68 | 1.53 | 7.5 |
| 9 | H43-1 V8 | 0.37 | 75.0 | 0.62 | 38.6 | 0.47 | 1.67 | 68 | 2.89 | 27.7 |
| 10 | H43-2 V16 | 0.15 | 95.3 | 0.00 | 29.0 | 0.12 | 0.00 | 64 | 1.43 | 9.2 |

TABLE 2

| | ETB (%) after ageing for x hours | | | | | | | | | | | | |
|---|---|---|---|---|---|---|---|---|---|---|---|---|---|
| Ex. | 0 | 48 | 52 | 56 | 60 | 64 | 68 | 72 | 76 | 80 | 84 | 88 | 92 | 96 |
| 1 | 144.89 | 129.07 | 128.59 | 127.41 | 117.30 | 119.95 | 105.68 | 104.73 | 90.99 | 76.45 | 74.09 | 56.92 | 63.69 | 25.94 |
| 2 | 151.64 | 138.82 | 124.04 | 127.01 | 117.02 | 112.58 | 99.94 | 86.65 | 80.23 | 36.18 | 24.22 | 8.12 | — | — |
| 3 | 158.89 | 137.33 | 116.67 | 135.59 | 124.10 | 117.17 | 105.28 | 82.54 | 86.17 | 57.87 | 30.99 | 24.67 | 5.65 | — |
| 4 | 156.18 | 136.40 | 127.95 | 125.54 | 118.30 | 106.05 | 109.77 | 57.13 | 24.50 | 4.53 | — | — | — | — |
| 5 | 151.05 | 133.48 | 117.14 | 116.11 | 100.59 | 90.99 | 80.65 | 17.81 | 27.76 | 5.62 | — | — | — | — |
| 6 | 140.73 | 127.29 | 114.75 | 103.00 | 66.08 | 20.97 | 26.60 | 4.56 | — | — | — | — | — | — |
| 7 | 148.01 | 105.82 | 108.62 | 79.11 | 76.23 | 93.73 | 65.80 | 5.53 | — | — | — | — | — | — |
| 8 | 139.19 | 122.43 | 128.29 | 112.87 | 110.59 | 79.41 | 3.36 | — | — | — | — | — | — | — |
| 9 | 153.79 | 123.81 | 111.20 | 104.63 | 88.14 | 50.28 | 9.38 | — | — | — | — | — | — | — |
| 10 | 135.03 | 116.48 | 97.66 | 80.78 | — | 2.13 | — | — | — | — | — | — | — | — |

The invention claimed is:

1. A co-extruded multi-layer biaxially oriented polyester film comprising a primary polyester layer and a dissimilar secondary polyester layer adjacent to the primary polyester layer, wherein the polyester of said primary polyester layer and said secondary polyester layer is polyethylene terephthalate, wherein the primary polyester layer and the secondary polyester layer each comprise a glycidyl ester of a branched monocarboxylic acid, wherein the monocarboxylic acid has from 5 to 50 carbon atoms, wherein said glycidyl ester is in the form of its reaction product with at least some of the end groups of the polyester, and wherein:
   (i) the glycidyl ester is present in the secondary polyester layer in an amount of at least 0.65 mol % based on the amount of polyester in the layer,
   (ii) the glycidyl ester is present in the primary polyester layer in an amount of 0.1 mol % to 0.65 mol % based on the amount of polyester in the layer, and
   (iii) the concentration of the glycidyl ester in the secondary layer [$GE_S$], the concentration of the glycidyl ester in the primary layer [$GE_P$], and overall concentration of glycidyl ester in the multilayer film [$GE_O$] is such that ([$GE_S$]/[$GE_P$])×[$GE_O$] is at least 0.7 mol %.

2. The polyester film according to claim 1, wherein the intrinsic viscosity of the polyester of at least one of the primary and secondary polyester layers is at least about 0.61.

3. The polyester film according to claim 1, wherein at least one of the primary and secondary polyester layers comprises a glycidyl ester having the formula (I):

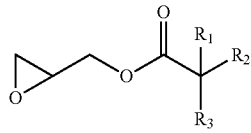

(I)

wherein:
$R^1$ and $R^2$ are independently selected from alkyl,
$R^3$ is selected from hydrogen and alkyl; and
wherein the total number of carbon atoms in the groups $R^1$, $R^2$ and $R^3$ is from 3 to 48.

4. The polyester film according to claim 3, wherein $R^1$ is methyl and $R^2$ and $R^3$ are independently alkyl, wherein the total number of carbon atoms in the alkyl groups $R^2$ and $R^3$ is from 2 to 47.

5. The polyester film according to claim 1, wherein the glycidyl ester in at least one of the primary and secondary polyester layers is reacted with the polyester by injecting the glycidyl ester into the molten polyester prior to the polymer being cast into a film.

6. The polyester film according to claim 1, wherein the total amount of glycidyl ester present in the multi-layer film is in the range of from 0.2 to 5.0 mol %, based on the amount of polyester in the film.

7. The polyester film according to claim 1, wherein the glycidyl ester is present in the secondary polyester layers in an amount in the range of from 0.65 mol % to 5 mol %, based on the amount of polyester in the secondary polyester layer.

8. The polyester film according to claim 1 wherein the concentration of the glycidyl ester in the secondary layer $[GE_S]$, the concentration of the glycidyl ester in the primary layer $[GE_P]$, and overall concentration of glycidyl ester in the multilayer film $[GE_O]$ is such that $([GE_S]/[GE_P])\times[GE_O]$ is at least 1.0 mol %.

9. The polyester film according to claim 8, wherein the ratio $[GE_S]:[GE_P]$ is at least 1.2:1.

10. The polyester film according to claim 1, wherein at least one of the primary and secondary polyester layers further comprises at least one metal cation selected from the group consisting of Group I and Group II metal cations.

11. The polyester film according to claim 10, wherein the reaction product of the glycidyl ester with the end groups of the polyester in at least one of the primary and secondary polyester layers is obtained by reacting the glycidyl ester with the end-groups of the polyester in the presence of at least one metal cation selected from the group consisting of Group I and Group II metal cations.

12. The polyester film according to claim 10, wherein the metal cations are selected from Group I metal cations.

13. The polyester film according to claim 12, wherein the primary polyester layer is free of particulate filler or comprises no more than 2.5% by weight of particulate filler.

14. The polyester film according to claim 13, wherein the amount of particulate filler in the primary polyester layer is less than 50% by weight of the amount of particulate filler in the secondary polyester layer.

15. The polyester film according to claim 1, wherein the primary polyester layer is optically clear or translucent.

16. The polyester film according to claim 1, wherein the secondary polyester layer comprises a particulate filler material.

17. The polyester film according to claim 16, wherein the particulate filler is selected from particulate inorganic fillers.

18. The polyester film according to claim 17, wherein the particulate filler is selected from alumina, titanic, talc, silica, calcined china clay, calcium carbonate and barium sulphate.

19. The polyester film according to claim 16, wherein the secondary polyester layer comprises from 0.3 to 30% by weight of particulate filler, based on the weight of polyester in the layer.

20. The polyester film according to claim 16, wherein the secondary polyester layer is an opaque white layer.

21. The polyester film according to claim 20, wherein the particulate filler is selected from titanium dioxide and/or barium sulphate.

22. The polyester film according to claim 20, wherein the amount of filler incorporated into the secondary polyester layer is in the range of from about 2% to about 30% by weight, based on the weight of polyester in the layer.

23. The polyester film according to claim 20, wherein the secondary polyester layer exhibits a TOD in the range from 0.3 to 1.75.

24. The polyester film according to claim 16, wherein the primary polyester layer accounts for greater than 50% of the total thickness of the primary and secondary polyester layers.

25. The polyester film according to claim 1, wherein at least one of the primary and secondary polyester layers comprises a UV-absorber.

26. The polyester film according to claim 25, wherein the amount of UV-absorber in the primary and/or secondary polyester layer is in the range of from 0.1% to 10% relative to the total weight of the layer.

27. The polyester film according to claim 25, wherein the UV-absorber is selected from benzophenones, benzotriazoles, benzoxazinones and triazines.

28. The polyester film according to claim 1, wherein at least one of the primary and secondary polyester layers comprises an antioxidant.

29. The polyester film according to claim 1, having one or more additional layers disposed on one or both surfaces thereof to form a multi-layer composite structure.

30. The polyester film according to claim 1 which exhibits an interlayer peel strength after 60 hours at 121° C. and 1.2 bar pressure and 100% relative humidity of at least 0.5 N, and/or a retention of interlayer peel strength ($R_{IPS}$) after 60 hours at 121° C. and 1.2 bar pressure and 100% relative humidity of at least about 30%, wherein $R_{IPS}=(IPS_T/IPS_0)\times 100$, and $IPS_0$ and $IPS_T$ are the interlayer peel strength values measured prior to the accelerated ageing test and after accelerated ageing for 60 hours at 121° C. and 1.2 bar pressure and 100% relative humidity, respectively.

31. The polyester film according to claim 1 which exhibits a hydrolysis resistance at 121° C. and 1.2 bar pressure and 100% relative humidity such that the elongation to break (ETB) of the film is at least 10% after at least 80 hours under said conditions.

32. A photovoltaic cell, wherein said photovoltaic cell comprises a front-plane, one or more electrode layers, a photovoltaic-active layer and a back-plane, wherein said back-plane comprises a co-extruded multi-layer biaxially oriented polyester film as defined in claim 1.

33. The photovoltaic cell according to claim 32, wherein the secondary polyester layer comprises a particulate filler material.

34. The photovoltaic cell according to claim 33, wherein the primary polyester layer of the co-extruded biaxially oriented polyester film is optically clear or translucent.

35. The photovoltaic cell according to claim 33, wherein the primary polyester layer of the co-extruded biaxially oriented polyester film is free of particulate filler or comprises no more than 2.5% by weight of particulate filler.

36. The polyester film according to claim 1, wherein the intrinsic viscosity of the polyester of at least one of the primary and secondary polyester layers is no more than 0.85.

37. A process for the manufacture of a co-extruded multi-layer biaxially oriented polyester film comprising a primary polyester layer and a dissimilar secondary polyester layer, wherein the process comprises:
   (i) co-extruding a primary polyester composition and a dissimilar secondary polyester composition, wherein the polyester of said primary polyester layer and said secondary polyester layer is polyethylene terephthalate, wherein the primary polyester composition and the secondary polyester composition each comprise a glycidyl ester of a branched monocarboxylic acid, wherein the branched monocarboxylic acid has from 5 to 50 carbon atoms, and wherein the glycidyl ester is present in the co-extrudate in the form of its reaction product with at least some of the end groups of the polyester;
(ii) quenching the co-extrudate;
(iii) stretching the quenched co-extrudate in two mutually perpendicular directions: and
(iv) heat-setting the film,
and wherein:
   (i) the glycidyl ester is present in the secondary polyester layer in an amount of at least 0.65 mol % based on the amount of polyester in the layer,
   (ii) the glycidyl ester is present in the primary polyester layer in an amount of 0.1 mol % to 0.65 mol % based on the amount of polyester in the layer, and
   (iii) the concentration of the glycidyl ester in the secondary layer $[GE_S]$, the concentration of the glycidyl ester in the primary layer $[GE_P]$, and overall concentration of glycidyl ester in the multilayer film $[GE_O]$ is such that $([GE_S]/[GE_P]) \times [GE_O]$ is at least 0.7 mol %.

38. The process according to claim 37, wherein the co-extruded biaxially oriented polyester film comprises a primary polyester layer and a dissimilar secondary polyester layer adjacent to the primary polyester layer, wherein the primary polyester layer and the secondary polyester layer each comprise a glycidyl ester of a branched monocarboxylic acid, wherein the monocarboxylic acid has from 5 to 50 carbon atoms, and wherein said glycidyl ester is in the form of its reaction product with at least some of the end groups of the polyester.

39. The process according to claim 37, wherein the co-extruding is at a temperature in the range of from about 280° C. to 300° C.

40. The process according to claim 37, wherein the heat-setting is at a temperature in the range of from about 200° C. to about 225° C.

* * * * *